(12) United States Patent
Wen et al.

(10) Patent No.: US 11,837,632 B2
(45) Date of Patent: Dec. 5, 2023

(54) WAFER

(71) Applicant: GlobalWafers Co., Ltd., Hsinchu (TW)

(72) Inventors: Chan-Ju Wen, Hsinchu (TW);
Chih-Wei Chang, Hsinchu (TW); Su Lien Chou, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 139 days.

(21) Appl. No.: 17/583,149

(22) Filed: Jan. 24, 2022

(65) Prior Publication Data

US 2022/0310784 A1 Sep. 29, 2022

(30) Foreign Application Priority Data

Mar. 24, 2021 (TW) ................................ 110110536
Jan. 20, 2022 (TW) ................................ 111102292

(51) Int. Cl.
*B32B 3/00* (2006.01)
*H01L 29/06* (2006.01)

(52) U.S. Cl.
CPC ................................ *H01L 29/0657* (2013.01)

(58) Field of Classification Search
CPC ................................................ H01L 21/02002
See application file for complete search history.

(56) References Cited

U.S. PATENT DOCUMENTS

| 2009/0020854 A1 | 1/2009 | Feng et al. |
| 2016/0064230 A1* | 3/2016 | Nishihara ............ B24B 37/042 451/41 |

FOREIGN PATENT DOCUMENTS

| JP | 2009259941 | 11/2009 |
| JP | 2010199336 | 9/2010 |
| JP | 2015037137 | 2/2015 |
| JP | 6246533 | 12/2017 |
| JP | 6576801 | 9/2019 |
| TW | 201301376 | 1/2013 |
| TW | 201742103 | 12/2017 |
| TW | 201813768 | 4/2018 |
| WO | 2017006447 | 1/2017 |

OTHER PUBLICATIONS

"Office Action of Japan Counterpart Application", dated May 9, 2023, p. 1-p. 6.
"Office Action of Taiwan Counterpart Application", dated Oct. 18, 2022, pp. 1-7.

* cited by examiner

*Primary Examiner* — Elizabeth E Mulvaney
(74) *Attorney, Agent, or Firm* — JCIPRNET

(57) ABSTRACT

Provided is a wafer including a ring part and a processed part. The processed part is connected to the ring part. The processed part has a top surface which has been grounded and a bottom surface opposite to the top surface. The processed part is surrounded by the ring part. A region where the top surface connects to the ring part is a curved surface curved upwards.

10 Claims, 9 Drawing Sheets

WAFER

CROSS-REFERENCE TO RELATED APPLICATION

This application claims the priority benefits of Taiwan application serial no. 110110536, filed on Mar. 24, 2021, and Taiwan application serial no. 111102292, filed on Jan. 20, 2022. The entirety of each of the above-mentioned patent applications is hereby incorporated by reference herein and made a part of this specification.

BACKGROUND

Technical Field

The disclosure relates to a wafer, particularly to a processed wafer.

Description of Related Art

In the semiconductor industry, the process of manufacturing wafers includes forming an ingot and then slicing the ingot to obtain a wafer. Ingots are manufactured, for example, in a high-temperature environment. Currently, the processes for forming ingots include the Czochralski method, physical vapor transport (PVT), high temperature chemical vapor deposition (HT-CVD), liquid phase epitaxy (LPE), etc.

When manufacture ingots, it is common to place a seed crystal in a high-temperature furnace. As the seed crystal contacts a gaseous or liquid raw material, the semiconductor material is formed on the surface of the seed crystal until an ingot with a desired size is obtained. Ingots come in different crystal structures, depending on how they are manufactured and the raw materials used.

After completing its growth, the ingot is then cooled to the room temperature by furnace cooling or other processes. When the crystal ingot is cooled down, the top and tail of the ingot in poor shape are then removed by a cutting machine before it is ground by a grinding wheel to a desired size (for example, 3 to 12 inches). In some instances, a flat edge or V-shaped groove is formed on the edge of the crystal ingot by grounding. The flat edge and the V-shaped groove are suitable for marking the crystal orientation for the ingot or for fixing the ingot.

The ingot is sliced in the next step to obtain multiple wafers. For example, the process of slicing the crystal ingot includes cutting it with a knife or steel wire with abrasive particles (such as diamond particles). Generally, after the ingot is sliced, the thickness of the wafer is adjusted by a polishing process, and this polishing process also makes the surface of the wafer relatively flat. However, during the wafer polishing, the abrasive or the particles generated by the grinding may easily scratch the surface of the wafer.

The wafer polishing process commonly adopted currently is likely to cause the wafer to crack due to the excessive processing strength when the wafer is processed to have a thinner thickness. In response to this issue, the Taiko grinding process is adopted when the thickness of the wafer needs to be less than 200 μm (or even less than 50 μm). When grinding the wafer, the Taiko grinding process leaves a certain thickness on the edge of the wafer to improve the structural strength of the wafer. However, such a design that leaves a thicker edge on the wafer also prevents the fine particles generated during the grinding or polishing of the wafer from being properly removed, which may easily cause unnecessary scratches and impacts on the wafer under process and may even compromise the processing quality and the geometric shape of the wafer. Therefore, it is still a problem to be solved to improve the particle removal ability of the wafer during grinding or polishing.

SUMMARY

The disclosure provides a wafer capable of improving the problem of scratches on the edges of the processed part.

At least one embodiment of the disclosure provides a wafer. The wafer includes a ring part and a processed part. The processed part is connected to the ring part. The processed part has a top surface which has been grounded and a bottom surface opposite to the top surface. The processed part is surrounded by the ring part. The region where the top surface connects to the ring part is a curved surface curved upwards, and the curved surface causes the thickness of the processed part in a local region where the ring part is connected to increase as the processed part approaches the ring part.

DESCRIPTION OF THE EMBODIMENTS

Figure 1:
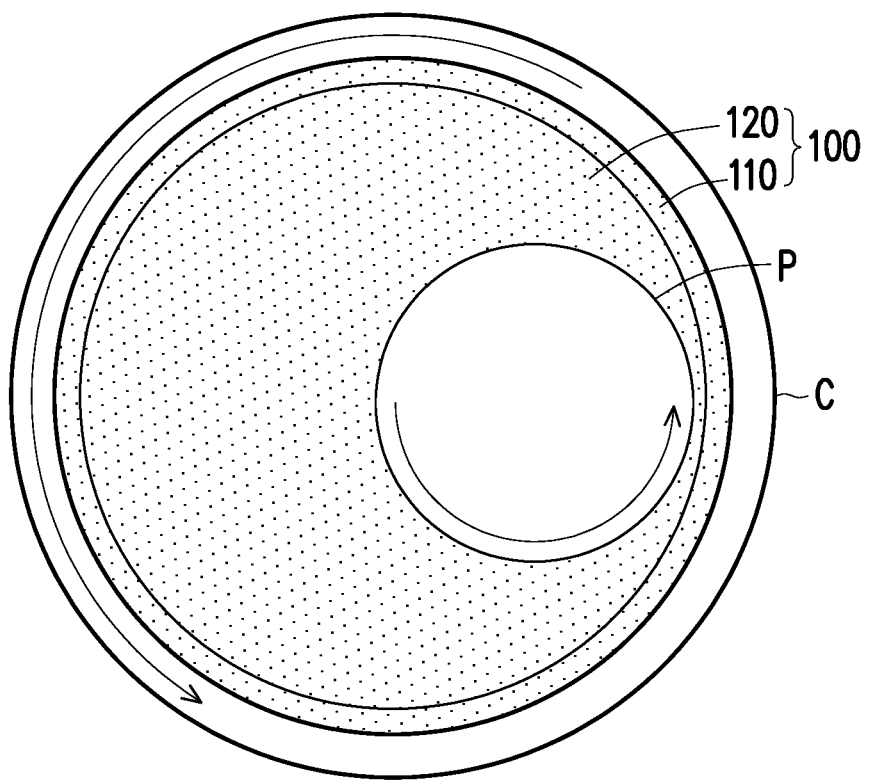
FIG. 1 is a schematic top view of a wafer polishing process according to an embodiment of the disclosure.
Figure 2:
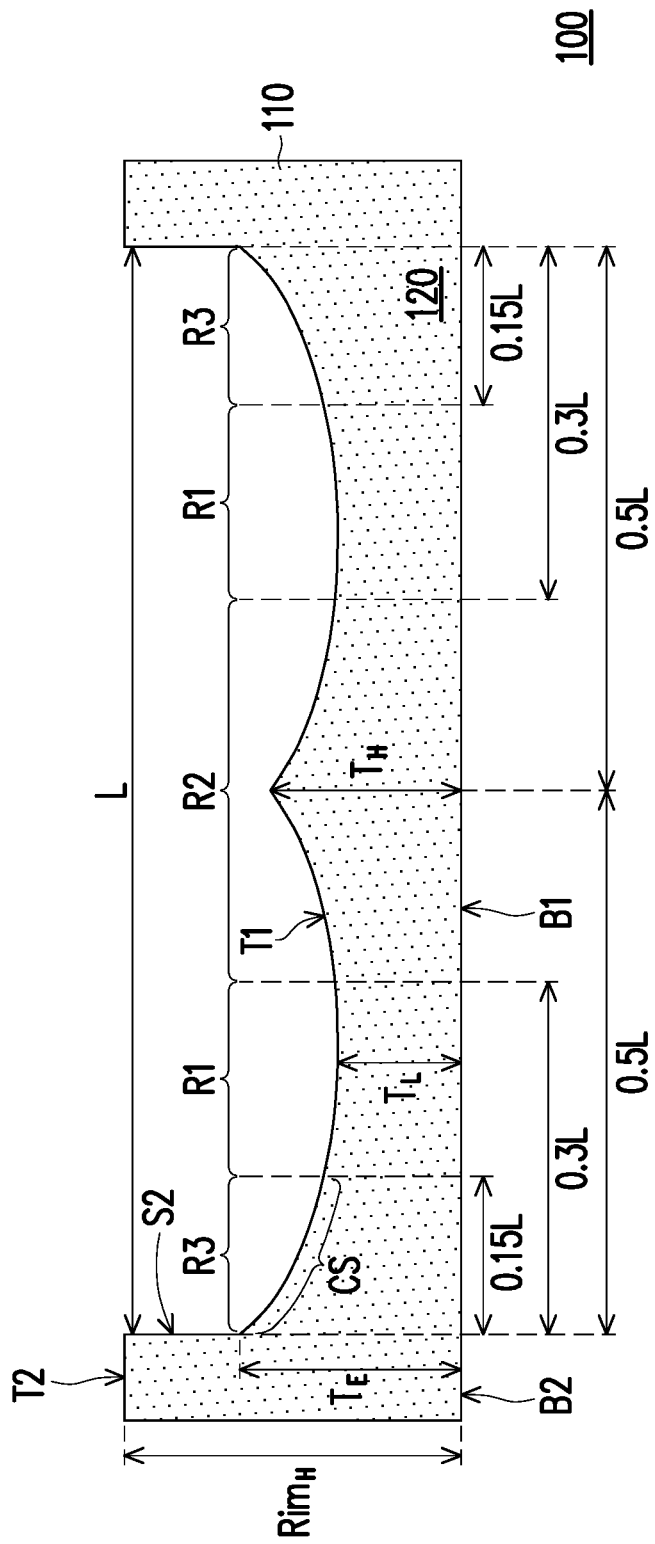
FIG. 2 is a schematic cross-sectional view of a wafer according to an embodiment of the disclosure.

FIG. 1 is a schematic top view of a wafer polishing process according to an embodiment of the disclosure. FIG. 2 is a schematic cross-sectional view of a wafer according to an embodiment of the disclosure.

In FIG. 1 and FIG. 2, a polishing process is performed on a wafer 100. For example, the wafer 100 is placed on a work platform C to polish the top surface of the wafer 100 with a polishing head P. In some embodiments, one of the working platform C and the polishing head P rotates in a clockwise direction and the other rotates in a counterclockwise direction, but the disclosure is not limited thereto. In this embodiment, the grinding process is Taiko grinding. In this embodiment, the material of the wafer 100 includes, for example, silicon (Si), gallium arsenide (GaAs), indium phosphide (InP), indium antimonide (InSb), gallium nitride (GaN), silicon carbide (SiC), zinc selenide (ZnSe), or other suitable semiconductor materials.

The polished wafer 100 includes a ring part 110 and a processed part 120. The processed part 120 is connected to the ring part 110. The processed part 120 has a top surface which has been grounded T1 and a bottom surface B1 opposite to the top surface T1. The processed part 120 is surrounded by the ring part 110. The thickness of the ring part 110 is greater than the thickness of the processed part 120, and therefore the ring part 110 increases the strength of the wafer 100 and reduces the warp of the wafer 100. In addition, since the ring part 110 of the wafer 100 is thick, the edge of the wafer 100 is not prone to cracks or chipping during processing.

In this embodiment, the region where the top surface T1 of the processed part 120 connects to the ring part 110 is a curved surface CS curved upwards (that is, a surface curved toward the direction close to a top surface T2 of the ring part 110), and the curved surface CS causes the thickness of the processed part 120 in a local region connecting the ring part 110 to increase as the processed part 120 approaches the ring part 110.

Figure 8A:
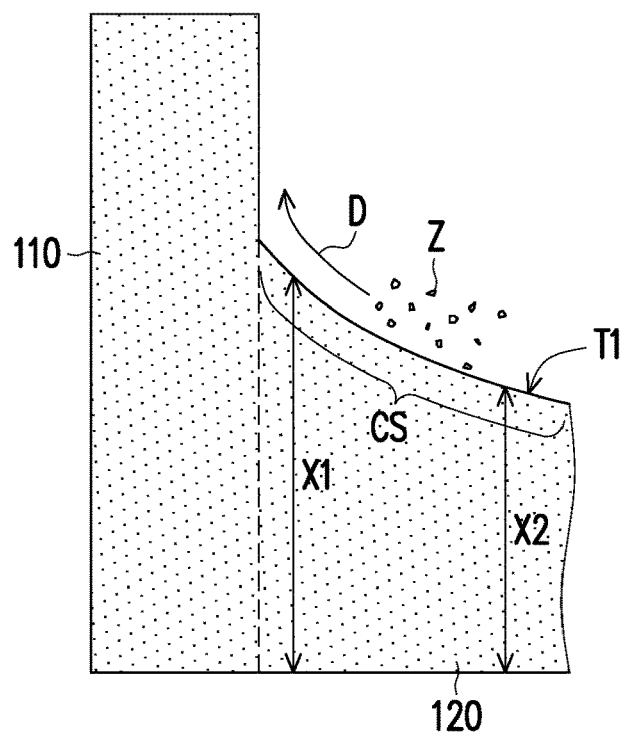
FIG. 8A is a schematic cross-sectional view of a partial region of a wafer according to an embodiment of the disclosure.

When the thickness of the processed part 120 in the local region connecting the ring part 110 increases as the processed part 120 approaches the ring part 110 as shown in FIG. 8A, it may be observed on the curved surface CS that a thickness X1 of the processed part 120 relatively close to the ring part 110 is greater than a thickness X2 of the processed part 120 relatively far away from the ring part 110. In this way, fine particles Z generated during the polishing process of the wafer may be easily removed along the curved surface CS (for example, along a direction D), preventing the fine particles Z from getting stuck at the boundary between the processed part 120 and the ring part 110, so as to reduce the scratches on the edge of the processed part 120. In some embodiments, the cross-sectional shape of the top surface T1 of the processed part 120 is W-shaped or U-shaped. Note that this embodiment does not restrict the thickness of the entire processed part 120 from increasing as the processed part 120 approaches the ring part 110.

Figure 8B:
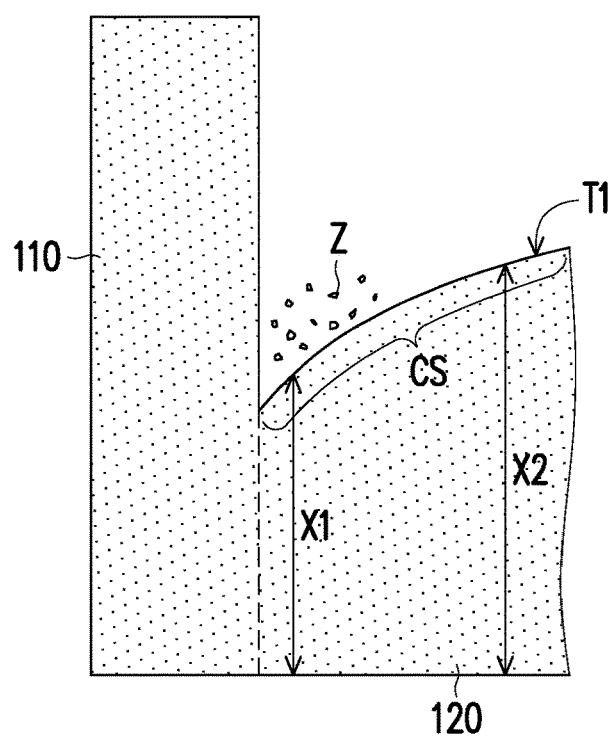
FIG. 8B is a schematic cross-sectional view of a partial region of a wafer according to a comparative example of the disclosure.

If the region where the top surface T1 of the processed part 120 connects to the ring part 110 is a curved surface CS facing downwards (that is, a surface curved in a direction away from the top surface T2 of the ring part 110) or a plane perpendicular to the side surface of the ring part, then the fine particles Z generated during the polishing process of the wafer 100 are likely to be stuck at the boundary between the processed part 120 and the ring part 110 and bring scratches on the edge of the processed part 120. These scratches may cause poor yields of film layers (such as epitaxial layers, metal layers, or insulating layers) that are subsequently deposited on the wafer 100. For example, as shown in FIG. 8B, the region where the top surface T1 of the processed part 120 connects to the ring part 110 is a curved surface CS that is curved downwardly. It may be observed on the curved surface CS that the thickness X1 of the processed part 120 relatively close to the ring part 110 is smaller than the thickness X2 of the processed part 120 relatively far away from the ring part 110. Therefore, the fine particles Z generated during the polishing process of the wafer are likely to get stuck at the boundary between the processed part 120 and the ring part 110, resulting in scratches on the edge of the processed part 120. In some embodiments, the region where the top surface T1 of the processed part 120 connects to the ring part 110 is a curved surface CS facing downwards, which makes the cross-sectional shape of the top surface T1 of the processed part 120 appear to be M-shaped or n-shaped.

Again in FIG. 1, in this embodiment, the structure of the top surface T1 of the processed part 120 is adjusted to further avoid scratches on the edge of the processed part 120 of the wafer 100. In this embodiment, the thickness of the ring part 110 is $Rim_H$ µm. $Rim_H$ is 200 µm to 1500 µm, and preferably 300 µm to 900 µm, and optimally 400 µm to 800 µm. In some embodiments, the ring part 110 of the wafer 100 is chamfered, as in the top surface T2 of the ring part 110 and a bottom surface B2 of the ring part 110 are curved or inclined, and the thickness $Rim_H$ of the ring part 110 is defined as the maximum thickness of the ring part 110 (that is, the maximum thickness from the top surface T2 to the bottom surface B2). In this embodiment, the polishing head P grinds downward along the side wall S2 of the ring part 110 so that the extending direction of the side wall S2 of the ring part 110 is substantially perpendicular to the work platform C (or the bottom surface B1 of the processed part 120). The bottom surface B1 of the processed part 120 is substantially flush with the bottom surface B2 of the ring part 110, or in other words, the bottom surface B1 and the bottom surface B2 are substantially continuous surfaces.

The maximum thickness of the place where the processed part 120 is connected to the ring part 110 is $T_E$ µm. In other words, the maximum thickness of the portion of the processed part 120 connecting the side wall S2 of the ring part 110 is $T_E$ µm. In yet other words, the distance from the boundary between the sidewall S2 of the ring part 110 and the top surface T1 of the processed part 120 to the bottom surface B2 of the ring part 110 is $T_E$ µm. The design of the curved surface CS is to make the chips generated during the process easy to remove. Therefore, it is better that the difference between the thickness $Rim_H$ and the thickness $T_E$ is smaller. In some embodiments, 0.5≤thickness $T_E$/thickness $Rim_H$≤1, and preferably 0.75≤thickness $T_E$/thickness $Rim_H$≤1.

The width (or diameter) of the processed part 120 is L mm, and L is 70 mm to 300 mm. The part where the processed part is located at a distance within 0.15 L from the ring part 110 is defined as an edge region R3. The curved surface CS is located in the edge region R3, and the curved surface CS causes the thickness of the processed part 120 in the edge region R3 to decrease as the processed part 120 is further away from the ring part 110. In this embodiment, the upper surface of the entire edge region R3 of the processed part 120 is the curved surface CS. That is, the horizontal width X (or the width of a vertical projection) of the curved surface CS is 0.15 L, but the disclosure is not limited thereto. In some embodiments, the horizontal width of the curved surface CS curved upwards in the edge region R3 is X, 0.01L≤X≤0.15 L. In a preferred embodiment, 0.02 L≤X≤0.14 L. In a more preferred embodiment, 0.03 L≤X≤0.13 L.

The part where the processed part 120 is located at a distance of 0.15 L to 0.3 L from the ring part 110 is defined as a first region R1. The thinnest part of the processed part is located in the first region R1, and the thickness of the thinnest part of the processed part R1 is $T_L$ µm. In this embodiment, ($T_E$-$T_L$) is 4 µm or more, so that the fine particles generated by the polishing wafer 100 are easier to be removed along the curved surface CS. In this embodiment, the thickness of the thinnest part from the top surface T1 of the processed part 120 to the bottom surface B1 of the processed part 120 is $T_L$ µm.

The part where the processed part 120 is located at a distance of 0.3 L to 0.5 L from the ring part 110 is defined as a second region R2. The thickness of the thickest part of the processed part 120 located in the second region R2 is $T_H$ μm, and $T_H$ is 0.1 $\text{Rim}_H$ to 0.7 $\text{Rim}_H$. In this embodiment, the thickness of the thickest part from the top surface T1 of the processed part 120 in the second region R2 to the bottom surface B1 of the processed part 120 in the second region R2 is $T_H$ μm. In this embodiment, $T_E$ is greater than $T_H$, and $T_H$ is greater than $T_L$. In some embodiments, the curved surface CS surrounds the first region R1 and the second region R2.

In this embodiment, the average thickness of the processed part 120 in the second region R2 is greater than the average thickness of the processed part 120 in the first region R1, which prevents the thinnest part of the processed part 120 from appearing in the second region R2, and reduces the probability of a part with a thickness less than $T_L$ appearing in the second region R2, thereby preventing the fine chips generated by the machining from staying in the second region R2, and increasing the probability of the fine chips being discharged from the edge region R3.

In this embodiment, the cross-sectional shape of the top surface T1 of the processed part 120 is similar to a W-shape.

Based on the above, the wafer 100 of this embodiment prevents the problem of scratches on the edge of the processed part 120 after grinding.

Figure 3:
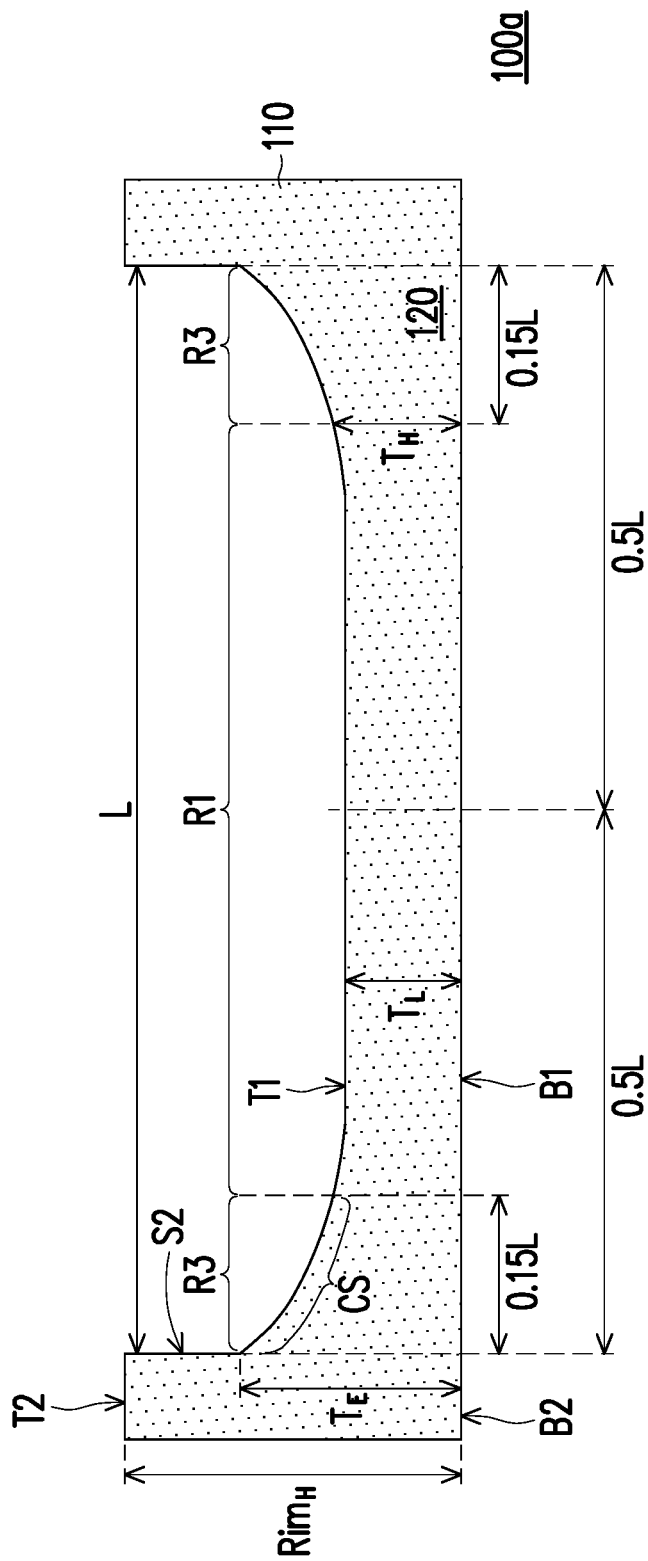
FIG. 3 is a schematic cross-sectional view of a wafer according to an embodiment of the disclosure.

FIG. 3 is a schematic cross-sectional view of a wafer according to an embodiment of the disclosure.

Note here that the embodiment of FIG. 3 adopts the same element numbers and part of the content of the embodiment of FIG. 1 and FIG. 2. The same or similar numbers represent the same or similar elements, and the same technical content is thus omitted. Please refer to the foregoing embodiment for the description of the omitted parts, which is not repeated hereinafter.

In FIG. 3, a polished wafer 100*a* includes a ring part 110 and a processed part 120. The processed part 120 is connected to the ring part 110. The processed part 120 has a top surface which has been grounded T1 and a bottom surface B1 opposite to the top surface T1. The processed part 120 is surrounded by the ring part 110. The thickness of the ring part 110 is greater than the thickness of the processed part 120, and therefore the ring part 110 increases the strength of the wafer 100*a* and reduces the warp of the wafer 100*a*. In addition, since the ring part 110 of the wafer 100 is thicker than the processed part 120, the edge of the wafer 100*a* is not prone to cracks or chipping during processing.

In this embodiment, the region where the top surface T1 of the processed part 120 connects to the ring part 110 is a curved surface CS curved upwards (that is, a surface curved toward the direction close to the top surface T2 of the ring part 110), so that the fine particles generated during the polishing process of the wafer 100*a* may be easily removed along the curved surface CS, which prevents the fine particles from getting stuck at the boundary between the processed part 120 and the ring part 110, reducing the scratches on the edge of the processed part 120.

In this embodiment, a part where the processed part 120 is located at a distance within 0.15 L from the ring part 110 is defined as an edge region is defined as the edge region R3. The curved surface CS causes the thickness of the processed part 120 in the edge region R3 to decrease as it is further away from the ring part 110, and the curved surface CS is located in the edge region R3. In this embodiment, the upper surface of the entire edge region R3 of the processed part 120 is the curved surface CS. That is, the horizontal width X of the curved surface CS is 0.15 L, but the disclosure is not limited thereto. In some embodiments, the horizontal width of the curved surface CS curved upwards in the edge region R3 is X, 0.01 L≤X≤0.15 L. In a preferred embodiment, 0.02 L≤X≤0.14 L. In a more preferred embodiment, 0.03 L≤X≤0.13 L.

In this embodiment, the part where the processed part 120 is located at a distance of 0.15 L to 0.5 L from the ring part 110 is defined as a first region R1. The thickness of the thinnest part of the processed part 120 in the first region R1 is $T_L$ μm. In other words, the thickness of the thinnest part from the top surface T1 of the processed part 120 in the first region R1 to the bottom surface B1 of the processed part 120 in the first region R1 is $T_L$ μm. The thickness of the thickest part of the processed part 120 in the first region R1 is $T_H$ μm. In yet other words, the thickness of the thickest part of the top surface T1 of the processed part 120 located in the first region R1 to the bottom surface B1 of the processed part 120 located in the first region R1 is $T_H$ μm. In some embodiments, the curved surface CS surrounds the first region R1.

In this embodiment, the thickest part of the processed part 120 in the first region R1 appears at the place where the first region R1 is closest to the edge region R3, but the disclosure is not limited thereto. The thickest part of the processed part 120 in the first region R1 appears in other places in the first region R1 in other embodiments.

In this embodiment, $(T_E - T_L)$ is equal to $(T_H - T_L + 1.5\ \mu m)$ or more, where $T_H$ is 0.1 $\text{Rim}_H$ to 0.7 $\text{Rim}_H$. In some embodiments, the first region R1 of the processed part 120 is substantially flat, that is, $T_H$ is equal to $T_L$, and therefore, $(T_E - T_L)$ is 1.5 μm or more.

In this embodiment, the cross-sectional shape of the top surface T1 of the processed part 120 is similar to a U-shape.

Based on the above, the wafer 100*a* of this embodiment avoids the problem of scratches on the edge of the processed part 120 after grinding.

Figure 4:
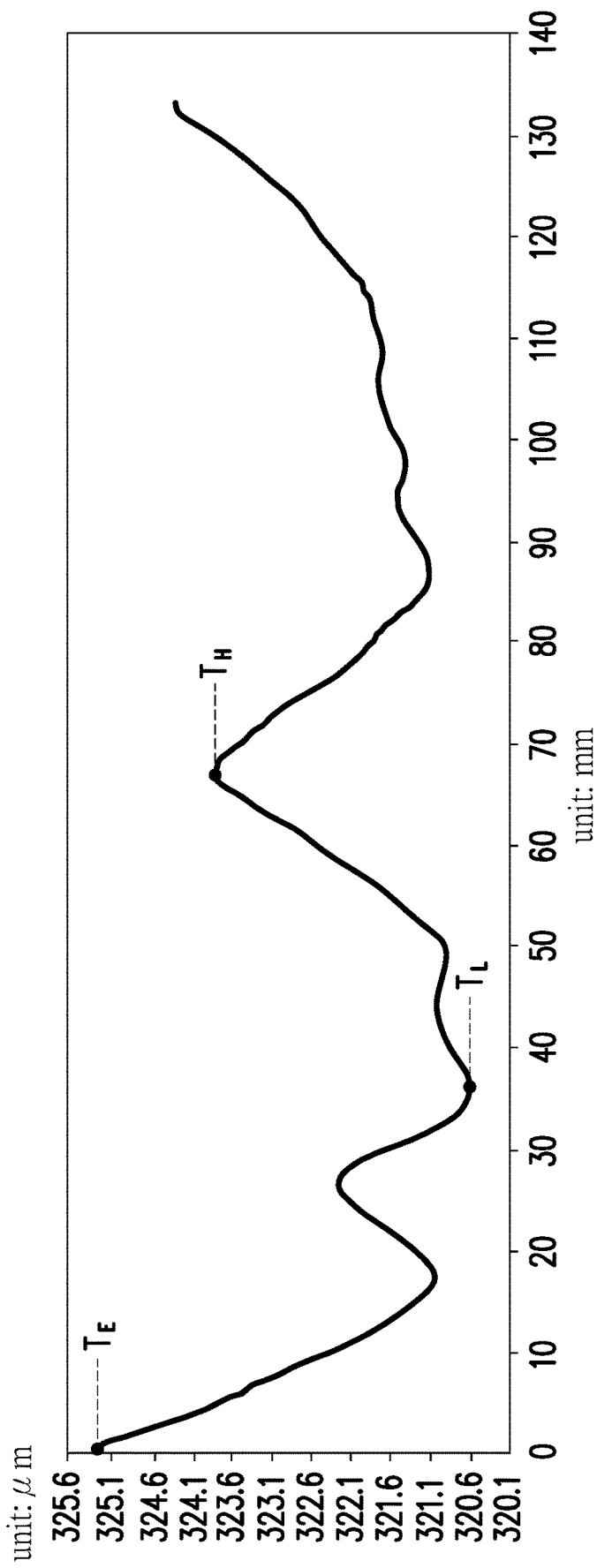
FIG. 4 is a graph of the thickness distribution of a cross-section of a processed part of a wafer according to an embodiment of the disclosure.
Figure 5:
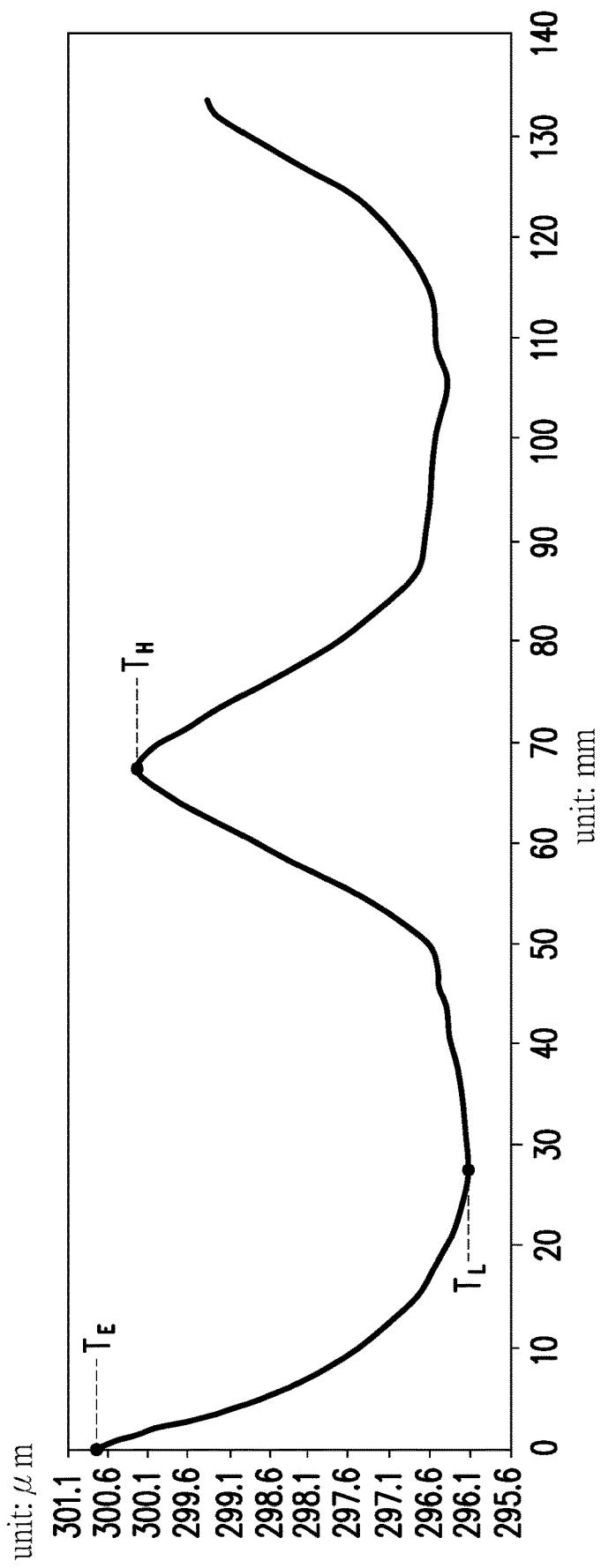
FIG. 5 is a graph of the thickness distribution of a cross-section of a processed part of another wafer according to an embodiment of the disclosure.

FIG. 4 is a graph of the thickness distribution of a cross-section of a processed part of a wafer according to an embodiment of the disclosure. FIG. 5 is a graph of the thickness distribution of a cross-section of a processed part of a wafer according to another embodiment of the disclosure.

Note here that the embodiment of FIG. 4 and the embodiment of FIG. 5 adopt the same element numbers and part of the content of the embodiments of FIG. 1 and FIG. 2. The same or similar numbers represent the same or similar elements, and the same technical content is thus omitted. Please refer to the foregoing embodiment for the description of the omitted parts, which is not repeated hereinafter.

In FIG. 4 and FIG. 5, the horizontal axis represents the lateral position of the cross section of the processed part of a wafer in millimeters; and the vertical axis represents the thickness of the processed part of the wafer at different places in μm. In the embodiment of FIG. 4 and the embodiment of FIG. 5, $T_E$ is greater than Tx, and Tx is greater than IL. $(T_E - T_L)$ is 4 μm or more.

Based on the above, the wafer avoids the problem of scratches on the edge of the processed part after grinding.

Figure 6:
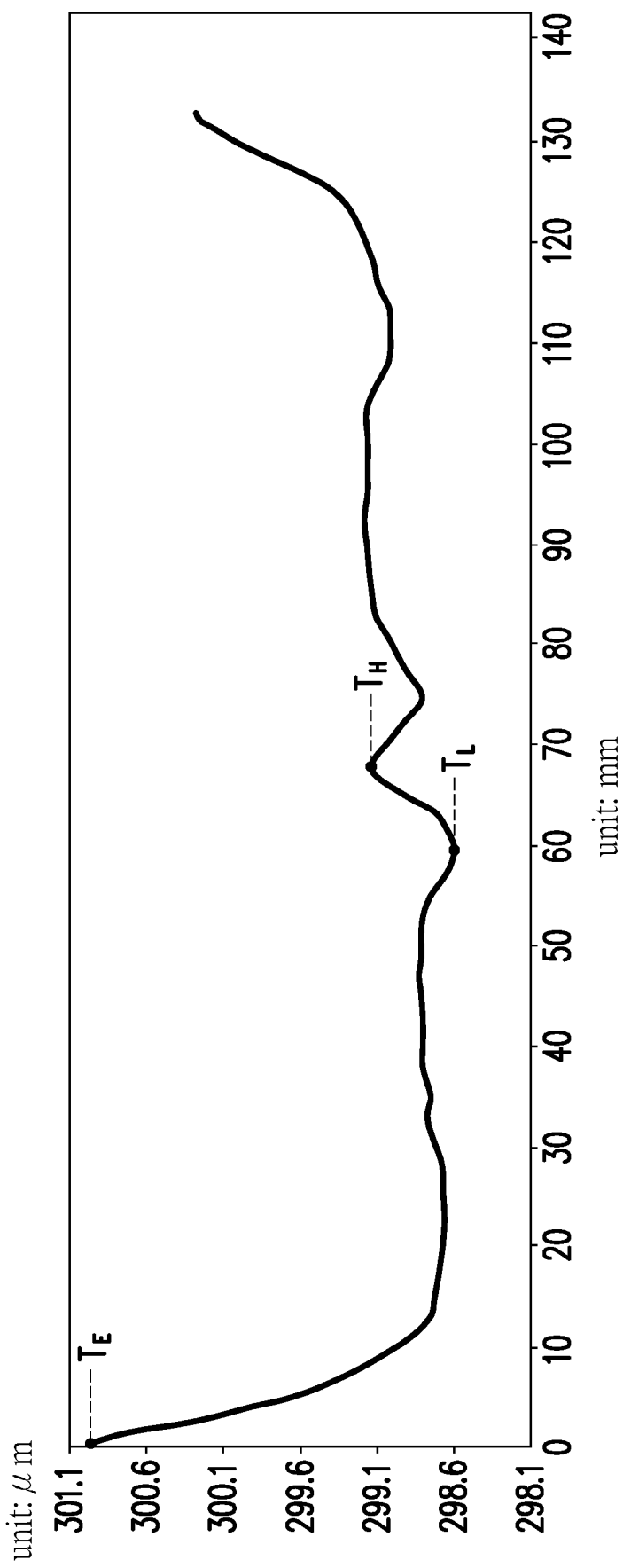
FIG. 6 is a graph of thickness distribution of a cross-section of a processed part of yet another wafer according to an embodiment of the disclosure.
Figure 7:
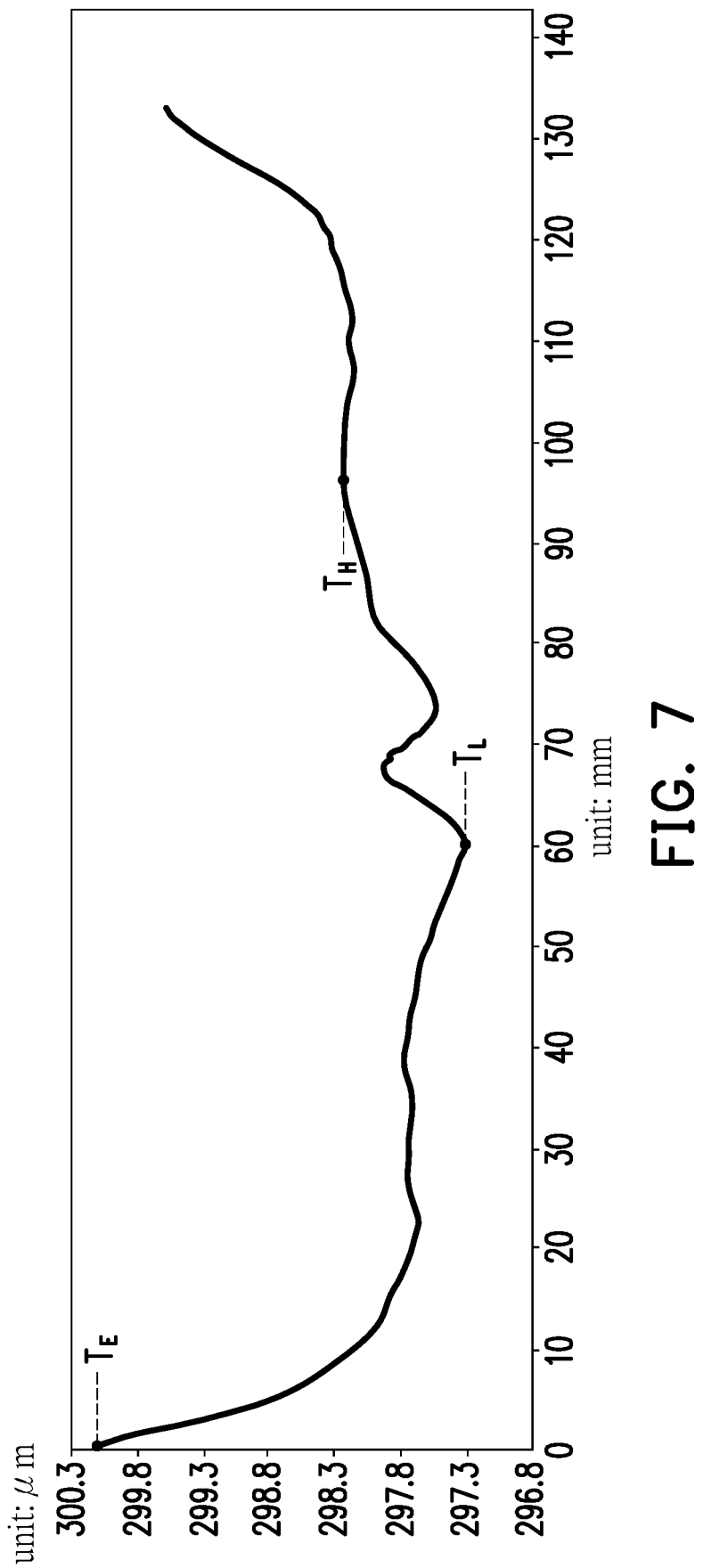
FIG. 7 is a graph of thickness distribution of a cross-section of a processed part of still another wafer according to an embodiment of the disclosure.

FIG. 6 is a graph of thickness distribution of a cross-section of a processed part of another wafer according to an embodiment of the disclosure. FIG. 7 is a graph of the thickness distribution of a cross-section of a processed part of a wafer according to still another embodiment of the disclosure.

Note here that the embodiment of FIG. 6 and the embodiment of FIG. 7 adopt the same element numbers and part of the content of the embodiment of FIG. 3. The same or similar numbers represent the same or similar elements, and the same technical content is thus omitted. Please refer to the foregoing embodiment for the description of the omitted parts, which is not repeated hereinafter.

In FIG. 6 and FIG. 7, the horizontal axis represents the lateral position of the cross section of the processed part of the wafer in millimeters; and the vertical axis represents the thickness of the processed part of the wafer at different places in µm. In the embodiment of FIG. 6 and the embodiment of FIG. 7, $T_E$ is greater than Tx, and Tx is greater than $T_L$. $(T_E-T_L)$ is greater than or equal to $(T_H-T_L+1.5\ \mu m)$.

Based on the above, the wafer avoids the problem of scratches on the edge of the processed part after grinding.

Figure 9:
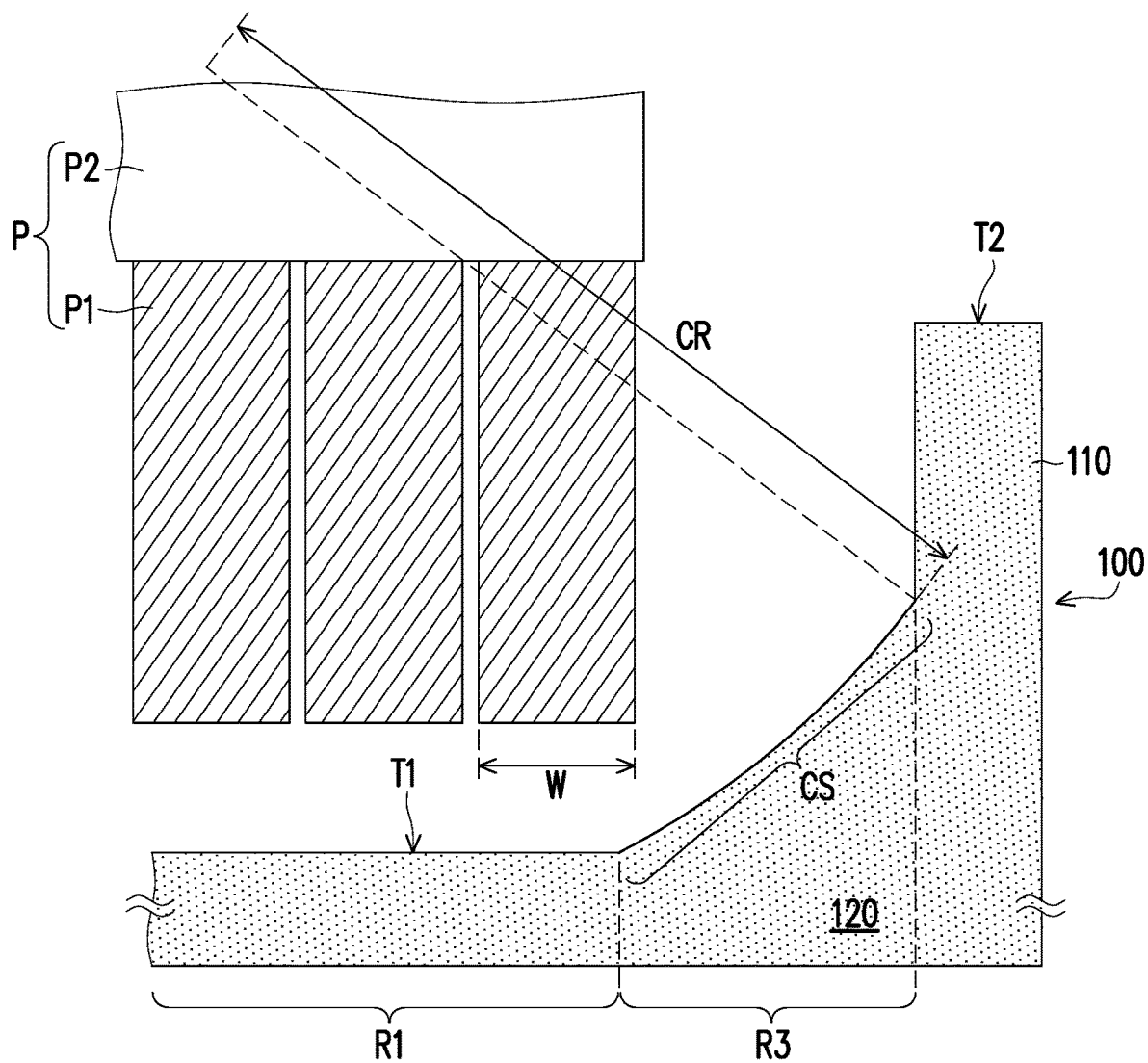
FIG. 9 is a schematic cross-sectional view of a wafer grinding process according to an embodiment of the disclosure.

FIG. 9 is a partial cross-sectional schematic diagram of a wafer grinding process according to an embodiment of the disclosure. For example, FIG. 9 is a partial cross-sectional schematic diagram of the grinding process of the wafer in any of the foregoing embodiments.

In FIG. 9, the wafer 100 is grinded by a polishing head P. In this embodiment, the polishing head P includes grinding abrasives P1 and grinding wheels P2. A plurality of grinding abrasives P1 are disposed on the grinding wheel P2. In this embodiment, the region where the top surface T1 of the processed part 120 connects the ring part 110 is a curved surface CS that is curved upwards (that is curved toward the direction close to a top surface T2 of the ring part 110), and the curved surface CS causes the thickness of the processed part 120 in a local region connecting the ring part 110 to increase as the processed part 120 approaches the ring part 110. In some embodiments, the width (or diameter) of the processed part 120 is L mm (please refer to FIG. 2 or FIG. 3), and the curvature radius of the radius corner of the curved surface CS is CR, 0.01 L≤CR≤L. In a preferred embodiment, 0.01 L≤CR≤0.5 L. In a more preferred embodiment, 0.01 L≤CR≤0.25 L. In some embodiments, the width W (or diameter) of the grinding abrasives P1 on the polishing head P is smaller than the curvature radius of the radius corner of the curved surface CS. Therefore, the polishing head P can better control the width and shape of the arc surface CS so as to make 0.01 L≤CR≤L.

What is claimed is:

1. A wafer, comprising:
a ring part; and
a processed part, connected to the ring part,
wherein the processed part has a top surface which has been grounded and a bottom surface opposite to the top surface, the processed part is surrounded by the ring part, a region where the top surface connects to the ring part is a curved surface curved upwards, and the curved surface causes a thickness of the processed part in a local region connecting the ring part to increase as the processed part approaches the ring part, wherein a width of the processed part is L mm, a part where the processed part is located at a distance within 0.15L from the ring part is defined as an edge region, and the curved surface causes a thickness of the processed part in the edge region to decrease as the processed part is further away from the ring part, and the curved surface is located in the edge region, and wherein a horizontal width of the curved surface is X, and 0.01L≤X≤0.15L, and wherein a curvature radius of radius corner of the curved surface is CR, and 0.01L≤CR≤L.

2. The wafer according to claim 1, wherein a maximum thickness of a place where the processed part is connected to the ring part is TE µm, a part where the processed part is located at a distance of 0.15L to 0.3L from the ring part is defined as a first region, a part where the processed part is located at a distance of 0.3L to 0.5L from the ring part is defined as a second region, a thinnest part of the processed part is located in the first region, and a thickness of the thinnest part of the processed part is $T_L$ µm, and a thickness of a thickest part of the processed part located in the second region is $T_H$ µm, wherein $(T_E-T_L)$ is 4 µm or more, a thickness of the ring part is $Rim_H$ µm, and $T_H$ is 0.1 $Rim_H$ to 0.7 $Rim_H$.

3. The wafer according to claim 2, wherein $T_E$ is greater than $T_H$, and $T_H$ is greater than $T_L$.

4. The wafer according to claim 2, wherein an average thickness of the processed part in the second region is greater than an average thickness of the processed part in the first region.

5. The wafer according to claim 2, wherein an extension direction of a side wall on an inner side of the ring part is perpendicular to the bottom surface of the processed part, and a distance from a boundary between the side wall of the ring part and the top surface of the processed part to a bottom surface of the ring part is $T_E$ µm, a thickness of the thinnest part from the top surface of the processed part to the bottom surface of the processed part is $T_L$ µm, and a thickness from the top surface of the processed part in the second region to the thickest part of the bottom surface of the processed part in the second region is $T_H$ µm.

6. The wafer according to claim 1, wherein a maximum thickness of a place where the processed part is connected to the ring part is $T_E$ µm, and a part where the processed part is located at a distance of 0.15L to 0.5L from the ring part is defined as a first region, wherein a thickness of a thinnest part of the processed part in the first region is $T_L$ µm, a thickness of a thickest part of the processed part in the first region is $T_H$ µm, wherein $(T_E-T_L)$ is equal to $(T_H-T_L+1.5\ \mu m)$ or more, a thickness of the ring part is $Rim_H$ µm, and $T_H$ is 0.1 $Rim_H$ to 0.7 $Rim_H$.

7. The wafer according to claim 6, wherein $T_H$ is equal to $T_L$, and $(T_E-T_L)$ is 1.5 µm or more.

8. The wafer according to claim 6, wherein an extension direction of a side wall on an inner side of the ring part is perpendicular to the bottom surface of the processed part, and a distance from a boundary between the side wall of the ring part and the top surface of the processed part to a bottom surface of the ring part is $T_E$ µm, a thickness of the thinnest part from the top surface of the processed part in the first region to the bottom surface of the processed part in the first region is $T_L$ µm, a thickness from the top surface of the processed part in the first region to the thickest part of the bottom surface of the processed part in the first region is $T_H$ µm.

9. The wafer according to claim 1, wherein the bottom surface of the processed part is substantially flush with a bottom surface of the ring part.

10. The wafer according to claim 1, wherein the maximum thickness of a position where the processed part connects the ring part is $T_E$ µm, the thickness of the ring part is $Rim_H$ µm, and $0.5 \leq T_E/Rim_H \leq 1$.

* * * * *